US010459787B2

(12) United States Patent
Yurzola et al.

(10) Patent No.: US 10,459,787 B2
(45) Date of Patent: *Oct. 29, 2019

(54) BAD COLUMN HANDLING IN FLASH MEMORY

(71) Applicant: SANDISK TECHNOLOGIES LLC, Plano, TX (US)

(72) Inventors: Damian Yurzola, Santa Clara, CA (US); Eran Sharon, Rishon Lezion (IL); Idan Alrod, Herzliya (IL); Michael Altshuler, Sunnyvale, CA (US); Madhuri Kotagiri, Santa Clara, CA (US); Rajeev Nagabhirava, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 27 days.

This patent is subject to a terminal disclaimer.

(21) Appl. No.: 15/709,769

(22) Filed: Sep. 20, 2017

(65) Prior Publication Data

US 2018/0024880 A1 Jan. 25, 2018

Related U.S. Application Data

(62) Division of application No. 14/841,317, filed on Aug. 31, 2015, now Pat. No. 9,792,174, which is a division of application No. 13/793,282, filed on Mar. 11, 2013, now Pat. No. 9,146,807.

(60) Provisional application No. 61/733,064, filed on Dec. 4, 2012.

(51) Int. Cl.
*G11C 29/00* (2006.01)
*G06F 11/10* (2006.01)
*G11C 29/52* (2006.01)

(52) U.S. Cl.
CPC ...... *G06F 11/1068* (2013.01); *G06F 11/1012* (2013.01); *G11C 29/52* (2013.01)

(58) Field of Classification Search
CPC ... G06F 11/1068; G06F 11/1012; G11C 29/52
See application file for complete search history.

(56) References Cited

U.S. PATENT DOCUMENTS

| 5,070,032 A | 12/1991 | Yuan et al. |
| 5,095,344 A | 3/1992 | Harari |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |

(Continued)

OTHER PUBLICATIONS

Eitan, et al., "NROM: A Novel Localized Trapping, 2-Bit Nonvolatile Memory Cell," IEEE Electron Device Letters, Nov. 2000, vol. 21, No. 11, pp. 543-545.

(Continued)

*Primary Examiner* — Samir W Rizk
(74) *Attorney, Agent, or Firm* — Foley & Lardner LLP

(57) ABSTRACT

In a flash memory, redundant columns are used alternatively as replacement columns for replacing bad columns or to provide additional redundancy for ECC encoding. Locations of bad columns are indicated to a soft-input ECC decoder so that data bits from bad columns are treated as having a lower reliability than data bits from other columns.

10 Claims, 10 Drawing Sheets

(56) References Cited

U.S. PATENT DOCUMENTS

| | | | |
|---|---|---|---|
| 5,661,053 | A | 8/1997 | Yuan |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 7,170,802 | B2 | 1/2007 | Cernea et al. |
| 7,447,066 | B2 | 11/2008 | Conley et al. |
| 7,904,783 | B2 | 3/2011 | Brandman et al. |
| 8,885,426 | B1 | 11/2014 | Burstein et al. |
| 9,146,807 | B2 * | 9/2015 | Yurzola ............... G06F 11/1068 |
| 9,189,329 | B1 | 11/2015 | Zhu et al. |
| 9,792,174 | B2 * | 10/2017 | Yurzola ............... G06F 11/1068 |
| 2008/0147968 | A1 | 6/2008 | Lee et al. |
| 2009/0103379 | A1 | 4/2009 | Zhang et al. |
| 2010/0115376 | A1 | 5/2010 | Shalvi et al. |
| 2011/0002169 | A1 | 1/2011 | Li et al. |
| 2012/0079355 | A1 | 3/2012 | Patapoutian et al. |
| 2012/0216094 | A1 | 8/2012 | Yoo et al. |
| 2013/0079355 | A1 | 3/2013 | Ceci et al. |

OTHER PUBLICATIONS

Non-Final Office Action issued on U.S. Appl. No. 13/793,282 dated Jan. 15, 2015.
Non-Final Office Action on U.S. Appl. No. 14/841,317 dated Mar. 20, 2017.
Notice of Allowance on U.S. Appl. No. 13/793,282 dated May 26, 2015.
U.S. Notice of Allowance on U.S. Appl. No. 14/841,317 dated Jun. 14, 2017.

* cited by examiner

BAD COLUMN HANDLING IN FLASH MEMORY

CROSS-REFERENCED APPLICATIONS

This application is a divisional of U.S. patent application Ser. No. 14/841,317, filed on Aug. 31, 2015, which in turn is a divisional of U.S. patent application Ser. No. 13/793,282, filed on Mar. 11, 2013, and further claims priority to U.S. Provisional Application No. 61/733,064, filed on Dec. 4, 2012, the entireties of which are incorporated by reference herein.

BACKGROUND

This application relates to the operation of re-programmable non-volatile memory systems such as semiconductor flash memory, and more specifically, to systems and methods for handling bad columns when they occur in such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Some portions of a memory array may be defective, for example, individual cells, or groups of cells may be defective. In some cases an entire bit line may be defective so that cells along the bit line cannot be reliably used. Columns containing such defective bit lines may be considered bad columns and may be replaced with redundant columns that are provided to allow operation of a memory array that contains one or more bad columns. Efficient use of redundant columns is generally desirable.

SUMMARY

In a flash, redundant columns may be used alternatively as replacement columns for replacing bad columns or to provide additional redundancy for ECC encoding. Locations of bad columns may be indicated to a soft-input ECC decoder so that data bits from bad columns may be treated as having a lower reliability than data bits from other columns.

An example of a method of operating a memory array that includes at least one bad column includes: determining location information for the at least one bad column; compressing the location information; providing the compressed location information to a soft-input ECC decoder as a first soft data indicating low likelihood for hard data obtained from the at least one bad column; and decoding hard data in combination with the soft data indicating low likelihood for the hard data obtained from the at least one bad column.

The providing step may include providing the compressed location information to a soft-input ECC decoder as soft data indicating low likelihood for hard data obtained from any column which shares the compressed location information of the said least one bad column. A high resolution read may be performed to obtain a second soft read data, the second soft read data combined with the first soft data. Compressing the location information may include dividing all columns into a plurality of sections and, in each section, treating a particular column as a bad column if the location information indicates that there is a bad column in any section of the plurality of sections at a location corresponding to the particular column. The memory array may consist of a plurality of columns, each of the plurality of columns containing a plurality of bit lines, and a column may be considered as a bad column if it contains at least one defective bit line. Location information may be determined for at least one defective bit line in the at least one bad column, and the compressed location information may include compressed bit line location information.

A method of operating a memory array may include: identifying a number of columns of the memory array as bad columns; ranking the identified bad columns; replacing high-ranked bad columns with redundant columns; recording low-ranked bad columns in a record; subsequently, storing data in the memory array including in the low-ranked bad columns; subsequently, reading the data from the memory array including from the low-ranked bad columns; identifying data from the low-ranked bad columns from the record; and performing soft-input Error Correction Code (ECC) decoding of the data, where data from the low-ranked bad columns is treated as having low likelihood in response to identifying the data as coming from the low-ranked bad columns. One or more redundant columns that are not used for replacement of high-ranked bad columns may be identified and used to provide additional redundancy for stored data. The identified bad columns may be ranked according to the number of bad bit lines per column. High-ranked bad columns may have a number of bad bit lines that is greater than a predetermined number and low-ranked bad columns may have a number of bad bit lines that is less than or equal to the predetermined number. The identified bad columns may be ranked according to ECC results from data stored in the bad columns.

A multi-plane flash memory array may include: a first plane of flash memory cells in which bad columns are replaced with replacement columns and are not used for storage of data; and a second plane of flash memory cells in which bad columns are used for storage of data, replacement columns of the second plane used to store Error Correction Code (ECC) encoded data.

The first plane may have a first number of bad columns and the second plane may have a second number of bad columns, the first number being less than the second number. The first plane may be on a first die and the second plane may be on a second die. The first die and the second die may be selected for the multi-plane flash memory array based on the first number and the second number. The multi-plane flash memory array may include a plurality of additional dies, each of the plurality of additional dies chosen based on respective numbers of bad columns in the dies.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
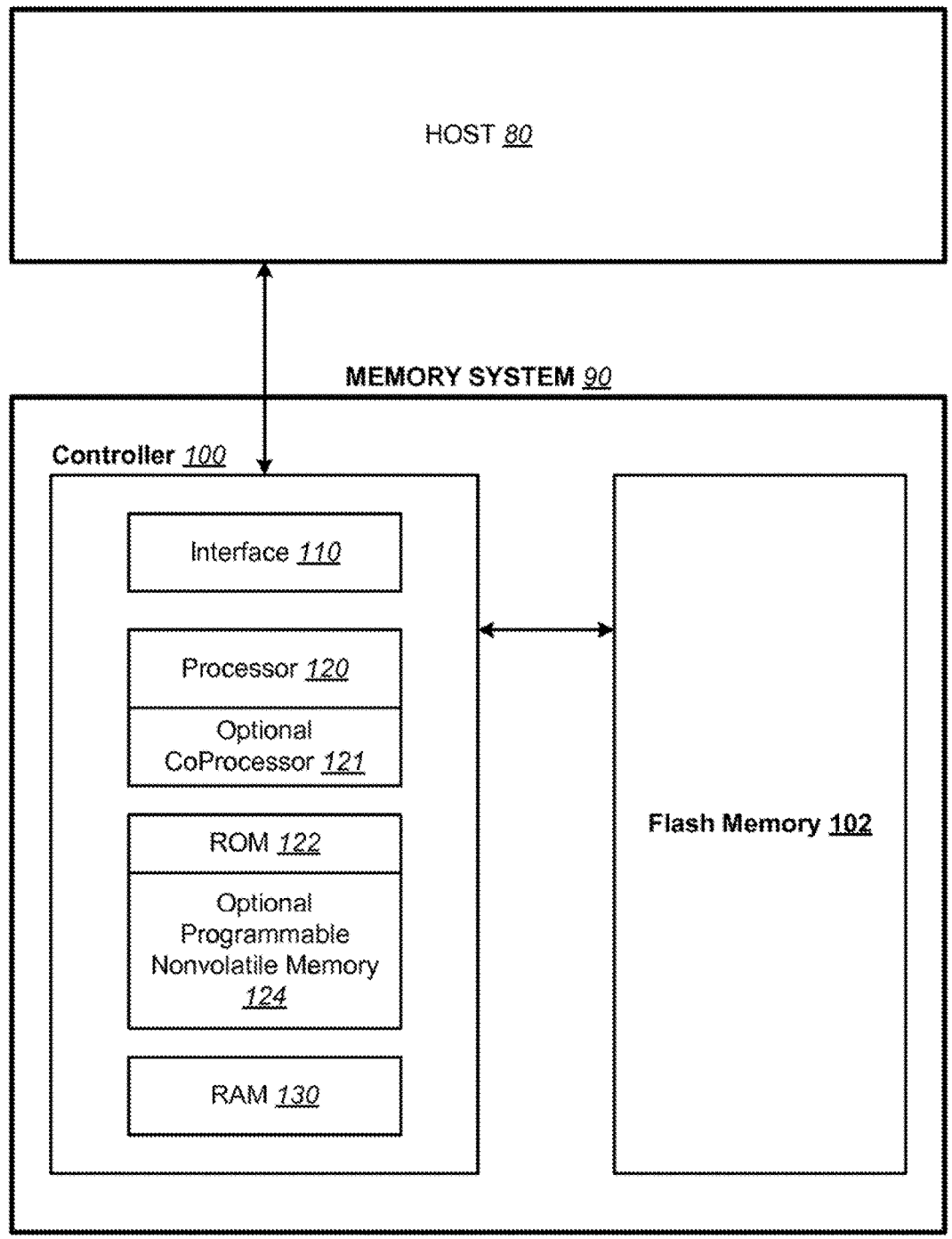
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a memory 102 whose operations are controlled by a controller 100. The memory 102 comprises one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 102. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown.) In yet another embodiment, the controller 100 is implemented within the host.

Physical Memory Structure

Figure 2:
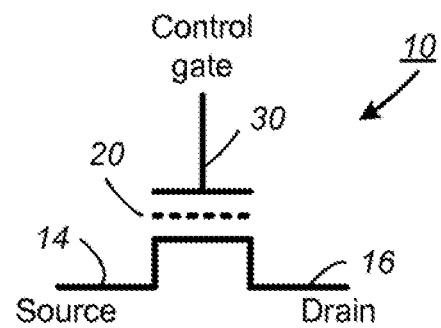
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661,053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

Figure 3:
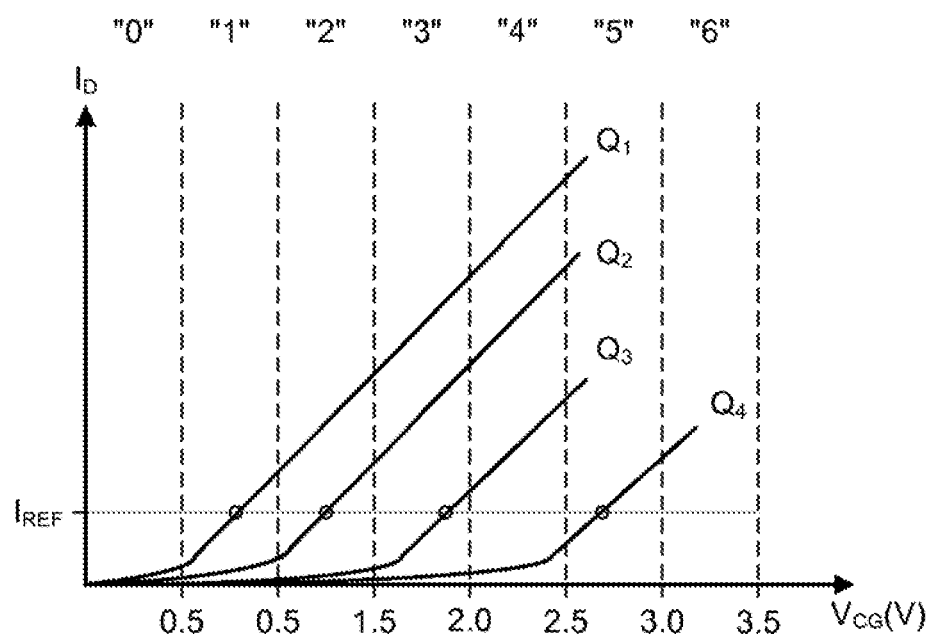
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", and the erased state (VCG<0, not shown in FIG. 3) may be demarcated by partitioning the threshold window into eight regions in intervals of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
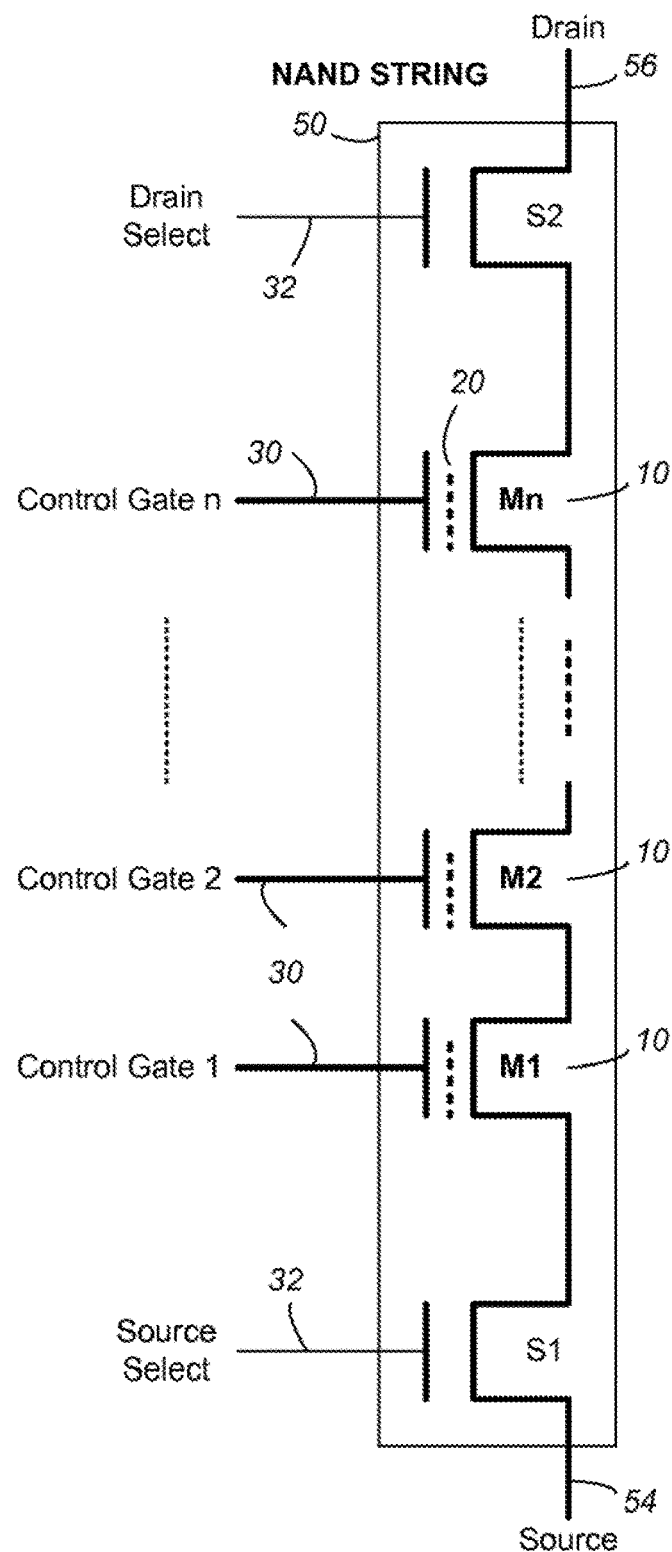
FIG. 4A illustrates schematically a string of memory cells organized into a NAND string.

FIG. 4A illustrates schematically a string of memory cells organized into a NAND string. A NAND string 50 comprises of a series of memory transistors M1, M2, M . . . n (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

Figure 4B:
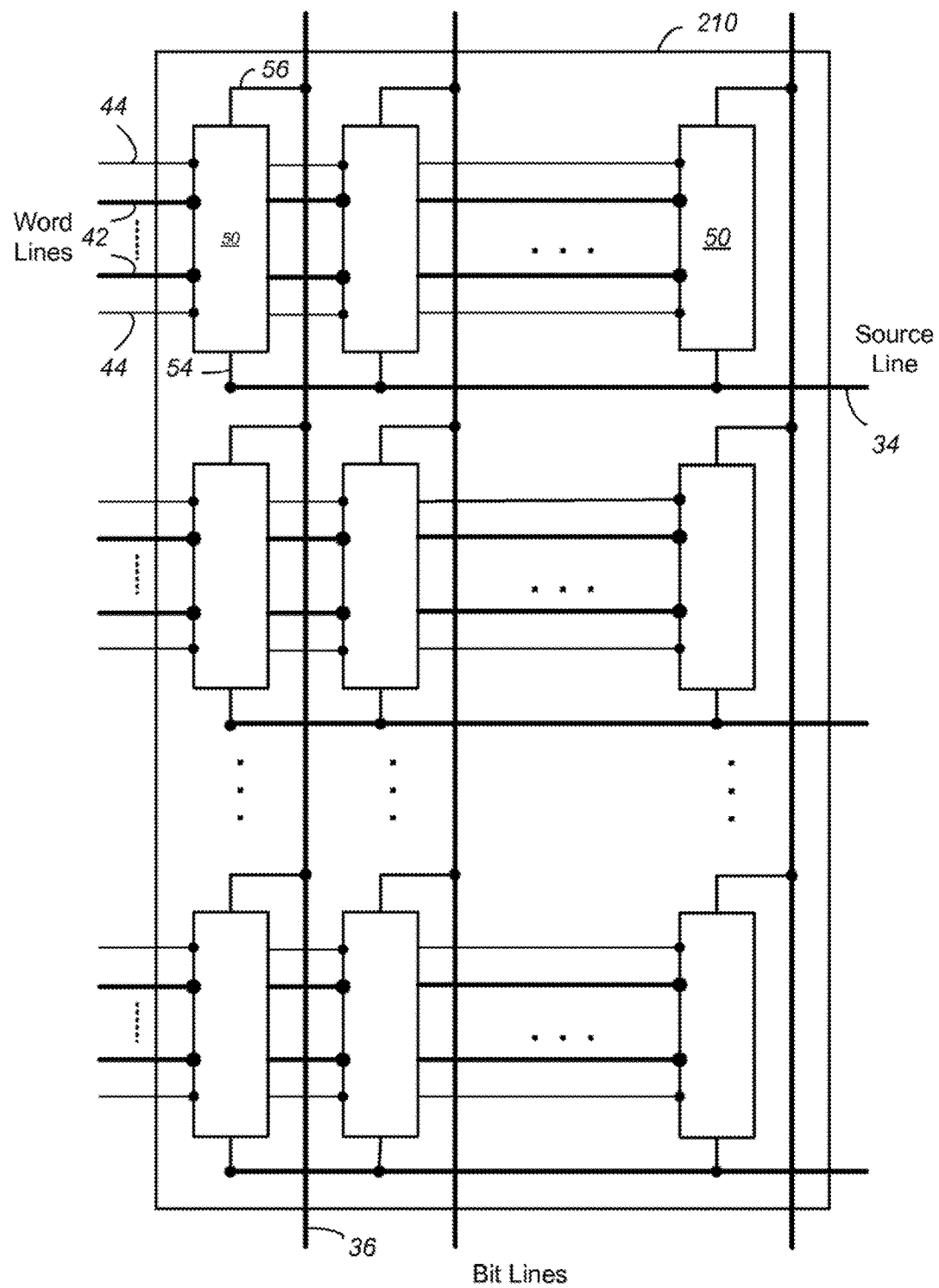
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. A bit line such as bit line 36 is coupled to the drain terminal 56 of NAND strings thus connecting NAND strings along the bit line direction. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
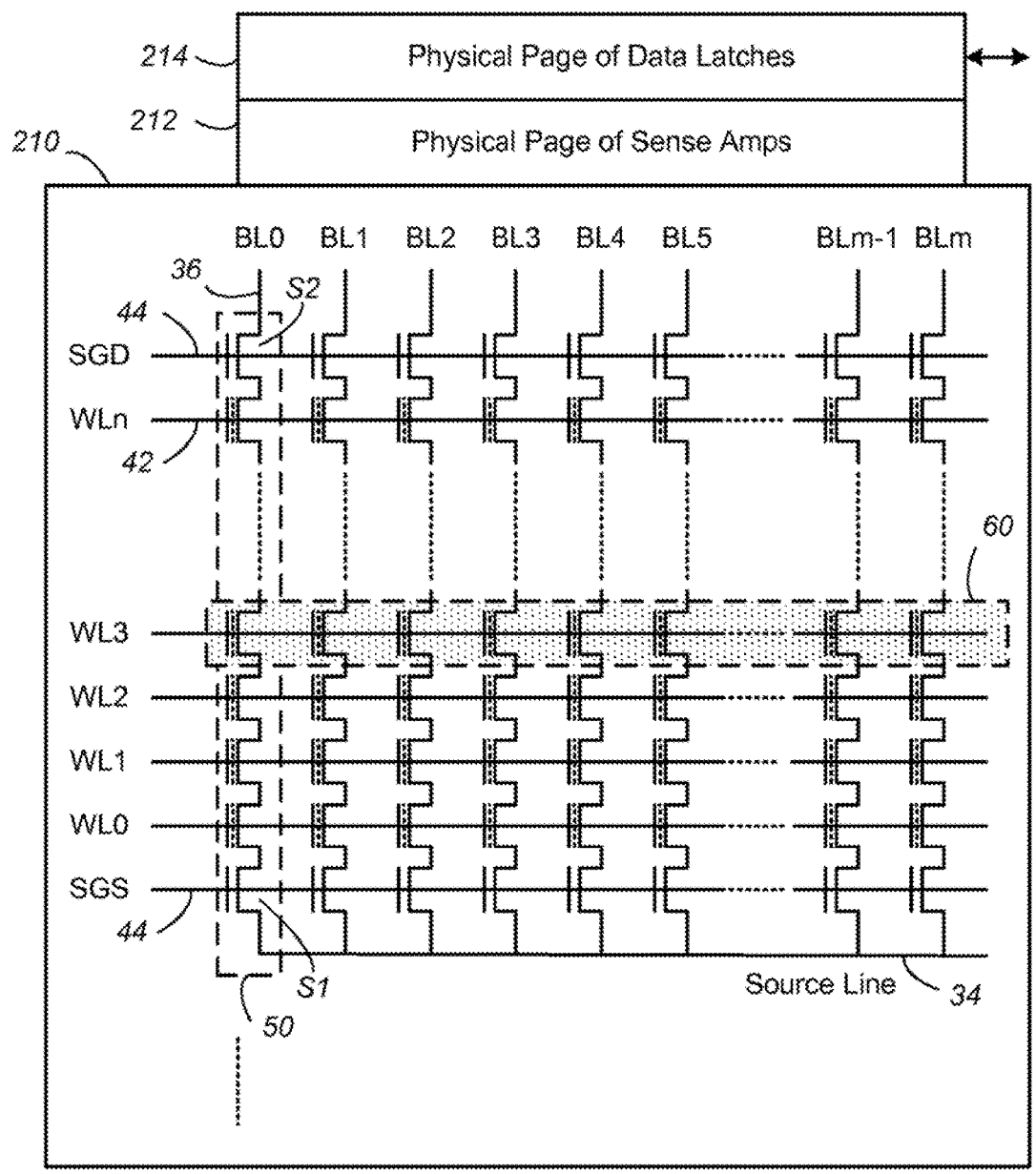
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Memory dies contain many memory cells and usually contain a certain number of defects. Some defects may cause an entire bit line to be defective because cells along the bit line cannot be programmed, or read, or both. A bit line may be considered defective even if some cells are usable when a number of defective cells exceeds a predetermined limit. Defects may be caused by physical flaws that occur during device formation, for example, as a result of contamination. If the number of such defective cells or defective bit lines is not too high, the memory die can generally be configured to deal with such defects, and may meet performance criteria and be sold for use. However, such configuration may require significant resources in some cases. If the number of defects is too high, the memory may be considered to be defective and may be discarded. Because of the high cost of discarding such dies it is generally desirable to operate dies with defects if possible rather than discard dies. However, it is desirable to do so in an efficient manner so that space on the die is not consumed unnecessarily and performance is not significantly impacted. Systems for dealing with defects include column replacement and ECC.

Figure 6:
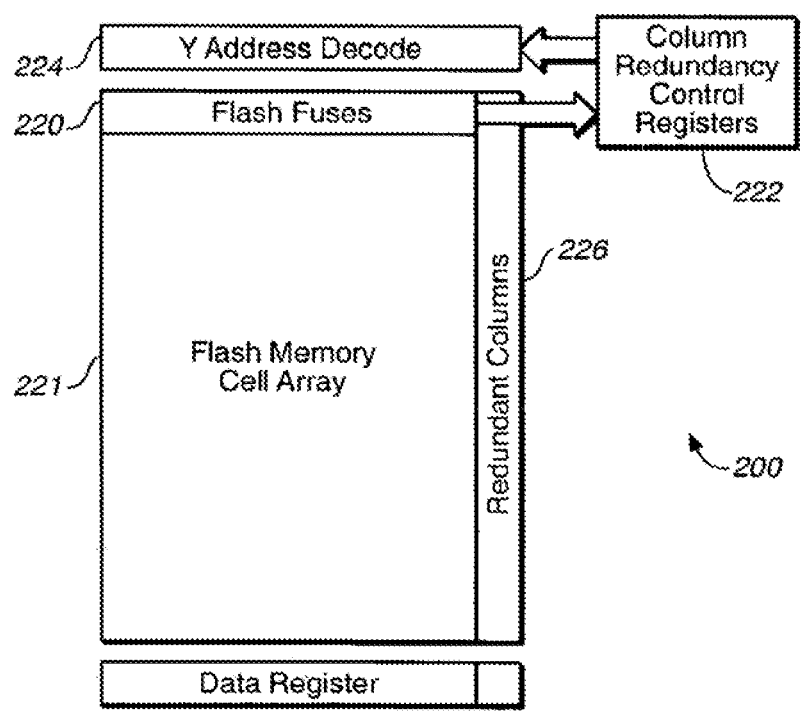
FIG. 6 shows an example of a flash memory with redundant columns.

FIG. 6 shows an example of a memory system 200 in which a flash memory array 221 has redundant columns 226 for replacing bad columns in memory array 221. Columns may be identified as "bad" during testing and flash fuses 220 may be used to record which columns are bad so that they are not used. Column redundancy control registers are responsible for using bad column data from the flash fuses to modify access to the flash memory cell array 221 so that access to a location that corresponds to a bad column is redirected to a redundant column that is used to replace the bad column. This may be done in a manner that is transparent to a memory controller, and to a host. The unit of replacement in such memory systems is a column that may consist of one bit line, or may consist of multiple bit lines depending on the memory design. Thus, for example, in FIG. 5 a column could consist of a single bit line so that BL0 could be individually replaced, or a column could consist of four bit lines so that BL0-BL3 would form one column, BL4-BL7 would form another column, etc. In another example, a column contains 16 bit lines. In some cases, a column may be considered to be a bad column if any bit line in the column is a bad bit line. Thus, in a column containing 16 bit lines, the column could be considered as a bad column because of a single bad bit line even if the other 15 bit lines in the column are fully functional.

ECC may be used to detect and correct errors below a certain number. The maximum number of correctable errors depends on the ECC scheme used. In general, more redundancy allows correction of more errors but with the added cost of the space needed to store the additional bits. There are several different types of ECC including soft-input ECC in which probability information is provided to an ECC decoder with respect to data bits being decoded and the ECC decoder uses the probability information to find the most likely solution. Such soft-input decoding may be used in charge storage memory, for example, by using a high-resolution read to resolve not only the memory state of a particular memory cell, but also the reliability of the read data (e.g. if the cell's threshold voltage is at the edge of the range assigned to the memory state, then the reliability of the data is low and the chance of an error is high, if it is in the middle then the reliability of the data is higher and chance of error is lower). Reliability may be measured by different metrics, where one of the commonly used metrics is the Log Likelihood Ratio (LLR). Examples of such soft-input decoding with flash memories are described in U.S. Pat. No. 7,904,783.

Figure 7:
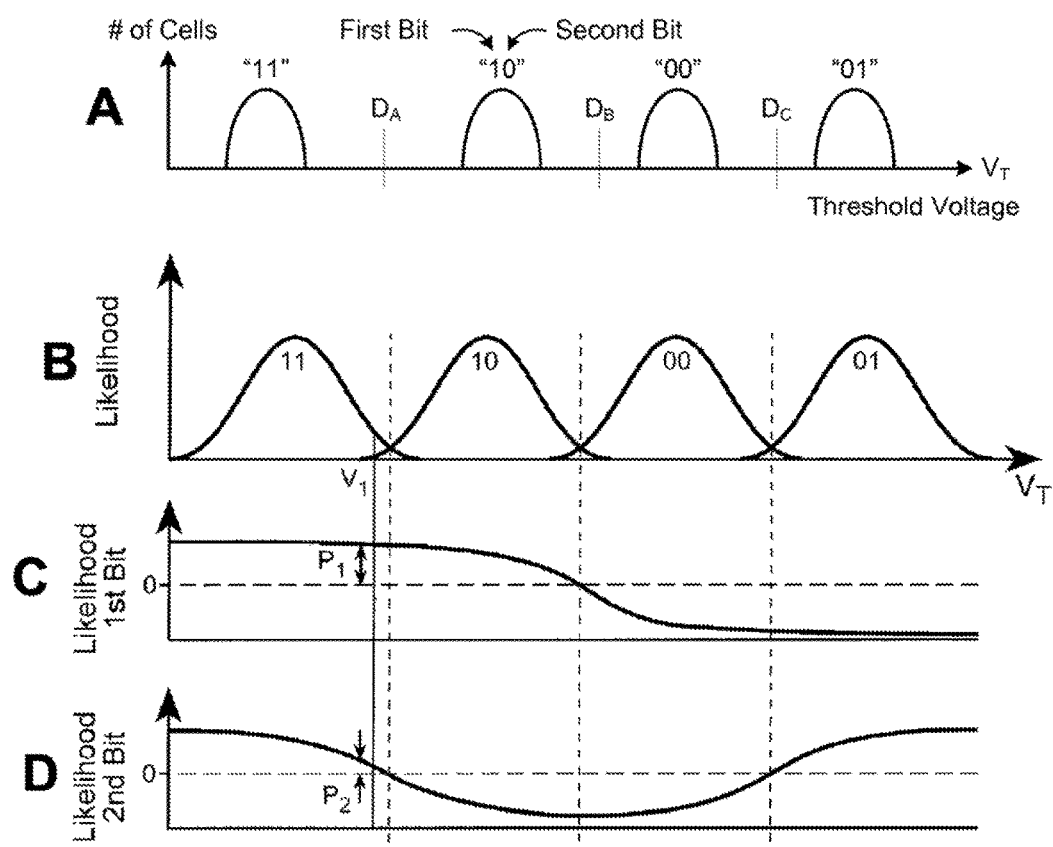
FIG. 7 illustrates likelihood for stored data bits.

FIG. 7 illustrates an example of soft data generated from a flash memory. FIG. 7A shows nominal, or ideal, distributions of memory cell threshold voltages in a four-state (two-bit) per cell MLC memory. The encoding scheme shown here ("11," "01," "10," "00") is simply one example and various other encoding schemes may be used. Memory cells may be initially programmed as shown but due to charge leakage, disturbance, or other mechanisms may later have different distributions that may be broader and may have some overlap.

FIG. 7B shows likelihood of a memory cell having been programmed to a particular state for a given threshold voltage ($V_{TH}$). It can be seen that likelihoods overlap somewhat so that there is some uncertainty where these distributions intersect (other examples may have more significant overlap particularly where device dimensions are small, and/or the number of memory states is high). Simply using the discrimination voltages $D_A$, $D_B$, $D_C$ does not reflect this uncertainty. For example, a cell with a threshold voltage $V_1$ was most likely programmed to state "11" but may also have been programmed to state "10" and may have a lower threshold voltage because of leakage, disturbance, or for some other reason. While using discrimination voltage $D_A$ may indicate that the cell is in state "11" it does not indicate the possibility that this is an error and that the cell was programmed to state "10." By performing a high-resolution read of threshold voltage, such probability information may be obtained, so that not only the state of the memory cell is obtained but some likelihood information regarding that state is also obtained.

FIG. 7C shows a plot of likelihood that the first bit is a 1. Because the two distributions on the left both have first bit=1 ("11" and "10") the probability is high on the left and drops on the right (where first bit=0 in states "00" and "01"). For a cell with threshold voltage $V_1$, it can be seen that the likelihood, or probability, that the first bit is a 1 is high as indicated by $P_1$.

FIG. 7D shows a plot of likelihood that the second bit is a 1. Because the two middle distributions both have a second bit=0 ("10" and "00") the probability is low in the middle and high on each side (where first bit=1 in states "11" and "00"). For a cell with threshold voltage $V_1$, it can be seen that the likelihood, or probability, that the first bit is a 1 is not very high as indicated by $P_2$ because $V_1$ is close to the boundary between "11" and "10" states.

It can be seen that likelihood information can sometimes be obtained on a bit-by-bit basis with different likelihoods for different bits stored in the same MLC cell. Likelihood information can be obtained in a similar manner for cells that store just one bit per cell (SLC).

Reliability information may be obtained and conveyed in different ways, for example, as log likelihood ratios. In general, higher resolution reading to get more accurate probability information requires more read steps, and thus takes more time, which is undesirable. Data bits may be categorized according to likelihood based on just a few read steps. For example, data bits may be categorized in two categories as having high or low likelihood of being correct, or into three categories as having high, medium, or low likelihood of being correct. Any number of categories may be used.

Figure 8:
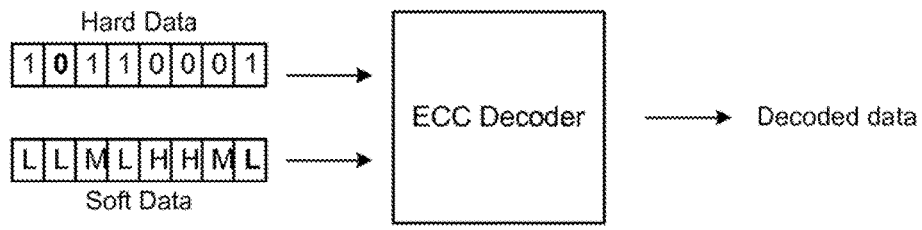
FIG. 8 shows an example of an ECC decoder.

FIG. 8 shows an example of how likelihood information may be used in ECC decoding. Both hard data and soft data are obtained from the memory array. Hard data is in the form of data bits, while soft data is given for each bit as either high "H," medium "M," or low "L." The ECC decoder uses the probability information to make the most likely corrections to the raw data (e.g. flipping bits with the lowest likelihood first when trying to find a solution).

In some memory systems, soft data may be obtained only when hard data is found to be uncorrectable by ECC. Thus, the extra time involved in obtaining soft data, and decoding using soft data, is only incurred when necessary. Faster hard-input decoding is used in other cases.

According to an aspect of the present invention, bad column or bad bit line data may be used in a similar manner to soft data that is obtained by a high resolution read. Instead of replacing a bad column, the bad column may continue to be used but with data from the bad column, or from certain bit lines of the bad column, marked as having a lower reliability than data from other columns. In this way, the ECC decoder can correct error bits resulting from bad columns. This may be done instead of, or in addition to, replacing some columns with redundant columns.

In general, bad columns or bit lines are identified during testing. Information regarding which columns or bit lines are bad may be stored so that it can be used by an ECC decoder. However, storing such information in an accessible form for use in a large memory array may require significant resources. A map of bad bit line locations is generally larger than a map of bad column locations because there are generally more bit lines than columns (e.g. 16 bit lines per column). While mapping bad bit lines may avoid characterizing good bit lines in bad columns as bad, this may consume significant storage. Therefore, mapping may be done on either a column-by-column or bit line-by-bit line basis depending on the particular application.

Figure 9A:
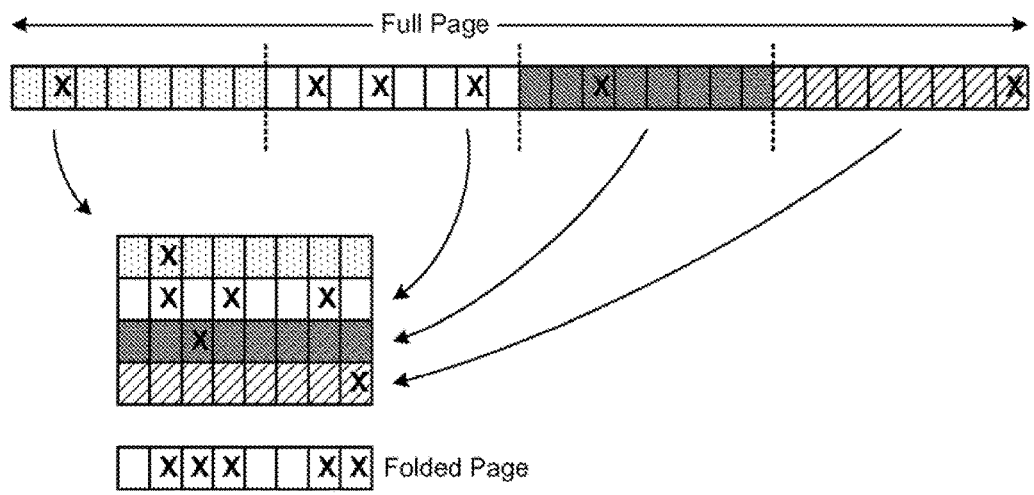
FIG. 9A shows an example of compression of bad column location information.

FIG. 9A shows an example of folding of bad column data so that less RAM is needed to store the data in an accessible form. A full page of bad column information is shown with an entry for every column in the memory array (may be multi-plane, multi-die memory array). An "X" indicates a bad column. The full page is divided into equal-sized sections. In this example, the full page consists of 32 columns which are divided into four sections of eight columns each. The entries in the sections are aggregated to generate a folded page in which an "X" signifies a bad column in at least one section at that location. Thus, folding provides a form of compression of the bad column data so that it can be more efficiently stored in an accessible manner. The folded page may be stored in RAM instead of the full page and an ECC decoder may apply the folded page data as soft data when decoding a section of a page. The choice of section size (number of sections) may depend on the full page size, ECC word size, and likely distribution of bad columns.

Figure 9B:
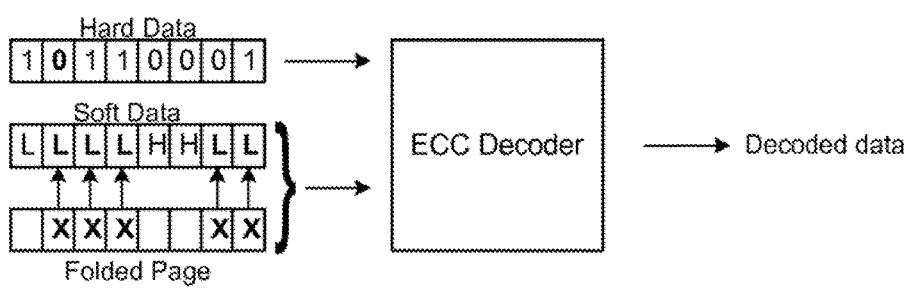
FIG. 9B shows an example of an ECC decoder using compressed bad column location information.

FIG. 9B shows how bad column or bad bit line data may be used in ECC decoding. Soft data may be combined with bad column data by replacing soft data entries with low (L) wherever an X indicates a bad column. Thus, the bad column data overrides any soft data for ECC correction. Bad column data may also be used without separate soft data input so that the extra time involved in a high resolution read is not incurred. For example, all hard input bits may be assigned a default likelihood (e.g. medium "M") with bad columns assigned a low likelihood "L." While the example of FIG. 9B shows a one-to-one correspondence between data bits and columns (i.e. one bit line per column) for simplicity, it will be understood that this approach may be applied to systems that mark columns containing multiple bit lines as bad. This approach may also be used where bad bit line mapping is used instead of bad column mapping.

Folding a full page of bad column or bad bit line data may provide false or "fake" indications that a column or bit line is bad (e.g. where there is a bad column in just one section a fake error will occur in same position in other sections that do not have a bad column at that location). However, the saving in RAM space may be worth any degradation in accuracy from such fake indications, especially when the expected number of bad bit lines in a bad column is low, (e.g. 1-2 bad bit lines in a column of 16).

While identification of bad columns, or bad bit lines, for ECC may be used instead of bad column replacement, it may also be combined with replacement so that some bad columns are replaced while others are utilized with an indication of lower reliability to the ECC decoder.

Figure 10A:
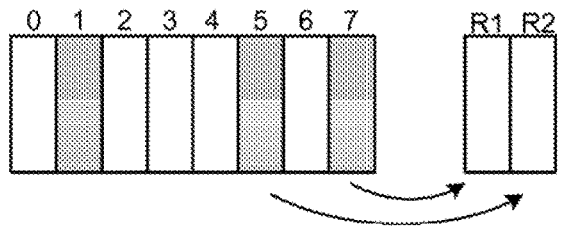
FIG. 10A shows redundant columns used to replace bad columns.
Figure 10B:
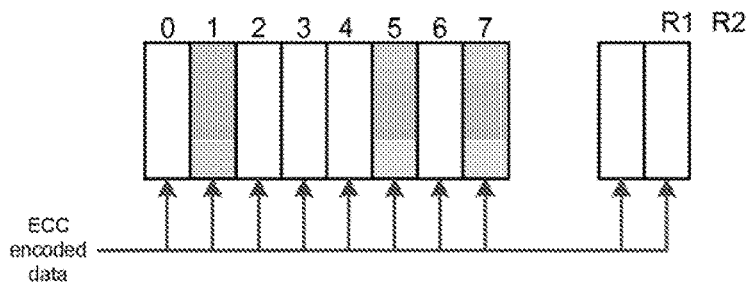
FIG. 10B shows redundant columns used to provide additional redundancy.

FIG. 10A shows a memory array in which some bad columns are replaced with redundant columns while others are not replaced. FIG. 10 shows 8 non-redundant columns (0-7) and two redundant columns (R1, R2). Three columns, 1, 5 and 7 are bad columns (indicated by shading). Columns 5 and 7 are replaced by columns R1 and R2. However, column 1 which is a bad column is not replaced and continues to be used with data from column 1 marked as having a lower reliability than data from other columns, relying on ECC to correct errors as described above. Thus, the memory array may be used even though the number of bad columns exceeds the number of redundant columns.

By using ECC to correct data in bad columns instead of using redundant columns to replace them, space may kept available in redundant columns in some cases. This space may be used to store additional ECC encoded data thus allowing a high degree of redundancy and thereby enabling correction of a larger number of errors. For example, in FIG. 10B, instead of replacing columns 5 and 7 by R1 and R2 as in FIG. 10A, redundant columns R1 and R2 are used to allow more redundancy. Thus, a larger amount of ECC encoded data (10 columns instead of 8 columns) is stored for a given amount or raw data, allowing a greater number of errors to be corrected.

A ranking system may be used to determine which bad columns to replace and which to leave in place. Bad columns may be ranked in any suitable manner. In one example, columns that each contain multiple bad bit lines are ranked according to the number of bad bit lines they contain. For example, in a column that contains 16 bit lines, the number of bad bit lines in a bad column may be from 1 to 16. Many bad columns may contain only one bad bit line, which can be dealt with relatively easily using ECC. Only bad columns with more than one bad bit line (or more than some other threshold number) may be replaced.

Figure 11:
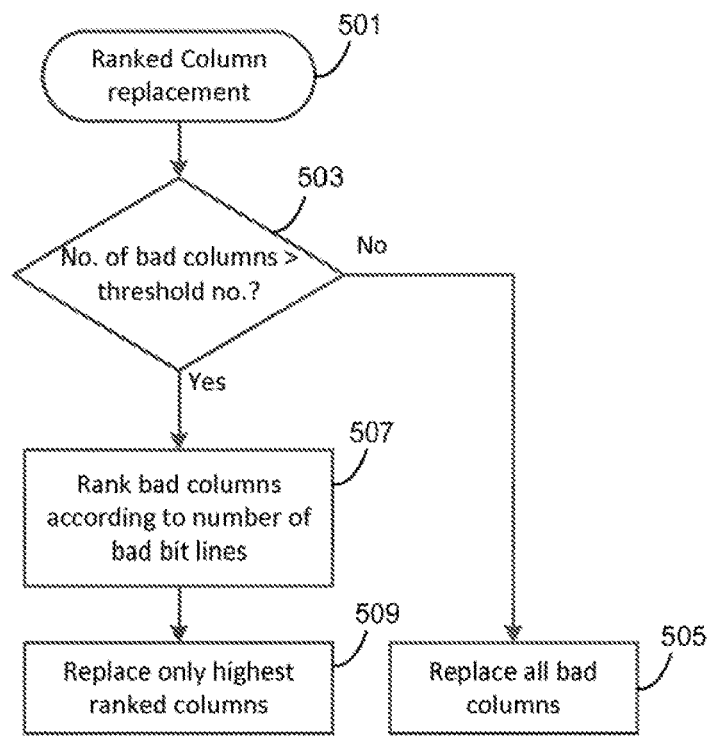
FIG. 11 illustrates a bad column replacement scheme.

FIG. 11 shows a scheme for ranked column replacement 501. The number of bad columns may be determined and compared to a threshold number 503. If the number of bad columns is equal to or less than the threshold number then all bad columns may be replaced 505. This is may be the easiest solution for relatively small numbers of bad columns (e.g. one or two bad columns). If the number of bad columns exceeds the threshold number then bad columns are ranked according to the number of bad bit lines they contain 507. Then, only the highest ranked columns are replaced 509. Other bad columns are mapped and bad column data or bad bit line data is used by the ECC decoder as previously described.

While ranking according to the number of bad bit lines is one possible scheme for ranking columns, other schemes may also be used. In some cases, columns may simply be replaced in the order in which they occur (e.g. starting at one side of a memory plane, the first n bad columns are replaced, where n is the number of redundant columns). If there are more bad columns than redundant columns, then ECC may be used for any bad columns that are not replaced. Such a scheme is less complex than a scheme that ranks columns in some manner and then replaces columns based on their ranking.

In some cases, defects other than bad columns or bad bit lines may be addressed by aspects of the present invention. For example, some physical topography features may indicate a pattern of defects that may be somewhat predictable. Where defects are predicted, soft data may be modified according to the predicted locations so that ECC decoding includes this information. For example, there may be a pattern of bad columns or bad bit lines found in a particular design, or lot, that may be used to predict locations in a particular die where bad devices might be expected (even if not detected as bad columns or bad bit lines in that particular die). These locations may then be marked in the same manner as bad columns or bad bit lines so that data bits read from these areas are marked as having a low likelihood.

While the above examples may be used to allow a plane in a memory array to operate when the number of bad columns in the plane exceeds the number of redundant columns in the plane, in some cases the additional time necessary for ECC decoding may make such a plane operate in manner that is not ideal, for example, operating outside some specified performance criteria. In general, such planes should be few in number. Thus, for example, in a multi plane die with two planes, the probability of having two such planes would be low.

In one example, a multi-plane die that has one or more planes with more bad columns than redundant columns may operate such planes using soft ECC and additional redundancy to address some or all of the bad columns. Other planes in the same die that have sufficient redundant columns may simply replace the bad columns with redundant columns.

Figure 12:
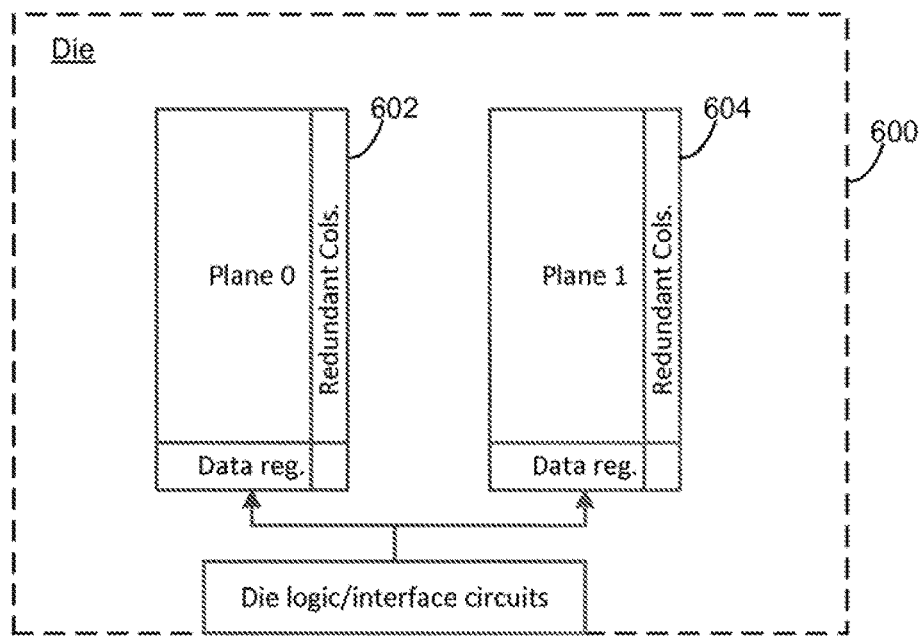
FIG. 12 shows an example of a multi-plane memory array on a die.

FIG. 12 shows an example of a memory die 600 that contains two planes, plane 0 and planet. Plane 0 has a number of bad columns that exceeds the number of redundant columns. Plane 0 is operated so that at least some of the redundant columns 602 of plane 0 are not used for replacement of bad columns, but instead are used to provide additional redundancy for ECC encoding. In contrast, redundant columns 604 of plane 1 are used for bad column replacement and are not used to provide any additional redundancy (a default ECC encoding scheme may be used that stores all encoded data in a number of columns that is equal to the number of non-redundant columns). In this example, plane 0 may not individually meet certain performance criteria because of the time needed to perform ECC correction. However, operating plane 0 and plane 1 in parallel allows the relatively poor performance of plane 0 to be combined with the better performance of plane 1 so that the die meets some specified performance criteria. Thus, a die that might otherwise be discarded may be sold for use.

Figure 13:
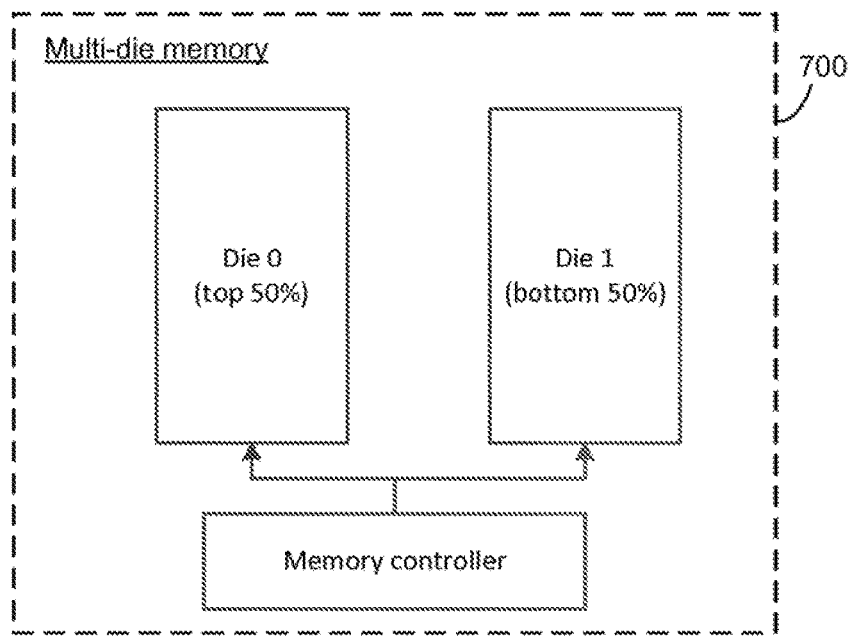
FIG. 13 shows an example of a multi-die memory array.

In many applications, multiple memory dies are combined to form a multi-die memory array, typically with a common memory controller as shown in FIG. 13. The number of such dies may be quite large, for example in Solid State Drives (SSDs). In one example, dies that are to be combined in a multi-die arrangement are grouped according to testing results that indicate how they are likely to perform together.

In particular, dies with a high number of bad columns may be grouped or paired with dies with a low number of bad columns.

FIG. 13 shows an example of a two-die memory array 700 in which the two memory dies, die 0 and die 1, are from a batch of memory dies (e.g. from the same wafer, same lot, same production run, or same test batch). Dies are sorted into two groups according to the number of bad columns in each die. Then dies from the top half (top 50%) of the batch, such as die 0, with a higher than average number of bad columns, are paired with dies from the bottom half (bottom 50%) of the batch, such as die 1, with lower than average number of bad columns. In this way, performance may be averaged out to an acceptable level, even where individual die performance may not be acceptable for every die. This approach is not limited to a simple two-die arrangement, but may be applied to any number of dies. Dies may be binned into more than two groups based on comparative criteria or some absolute criteria (e.g. number of bad columns). Schemes for selecting dies for multi-die arrangements may then be based on particular limits for such criteria (e.g. no more than one die from bottom 10%, or no more than one die with more than 8 bad columns).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A nonvolatile memory system comprising:
   a memory array having a plurality of columns, each of the plurality of columns comprising one or more bit lines; and
   a soft-input error correction code decoder configured to receive hard data and soft data for at least one bad column of the plurality of columns and further configured to decode the hard data in combination with the soft data to generate decoded data,
   wherein the soft data comprises compressed information including indication of locations of bad data within the at least one bad column, and
   wherein the locations of bad data are replaced by indications of low likelihood.

2. The nonvolatile memory system of claim 1, wherein the at least one bad column comprises at least one defective bit line.

3. The nonvolatile memory system of claim 1, wherein the compressed information comprises compressed bit line location information.

4. The nonvolatile memory system of claim 1, wherein the compressed information is obtained by dividing the plurality of columns into a plurality of sections and aggregating the plurality of sections into a folded page.

5. The nonvolatile memory system of claim 4, wherein a folded page column within the folded page is indicated as a bad column based upon a location of the folded page column corresponding to a bad column location in any of the plurality of sections.

6. The nonvolatile memory system of claim 1, wherein the memory array is a NAND flash memory array.

7. The nonvolatile memory system of claim 1, wherein the plurality of columns comprise a plurality of non-redundant columns having the at least one bad column, and one or more redundant columns.

8. The nonvolatile memory system of claim 7, wherein a portion of the at least one bad columns is replaced by the one or more redundant columns.

9. The nonvolatile memory system of claim 7, wherein at least one of the one or more redundant columns is configured to store error correction code data.

10. The nonvolatile memory system of claim 7, wherein each of the at least one bad column is assigned a rank between a high rank and a low rank.

* * * * *